United States Patent [19]

Walton et al.

[11] Patent Number: 4,980,635
[45] Date of Patent: Dec. 25, 1990

[54] INTEGRATED CIRCUIT PACKAGE CARRIER

[75] Inventors: R. Thomas Walton, Torrance; James A. Hathaway, Redondo Beach; Michael D. Runyan, Torrance; Michael L. Turnage, Sunnymead, all of Calif.

[73] Assignee: Hughes Aircraft Company, Los Angeles, Calif.

[21] Appl. No.: 686,335

[22] Filed: Dec. 26, 1984

[51] Int. Cl.⁵ ........................... G01R 1/00; G01R 1/02
[52] U.S. Cl. ............................... 324/158 F; 324/72.5; 324/158 P; 439/68; 439/73
[58] Field of Search ............ 324/73 PC, 158 P, 158 F; 339/17 CF, 75 MP, 175 R, 175 C, 176 MP; 206/328, 329, 331, 334; 439/482, 68, 70, 72, 73

[56] References Cited

U.S. PATENT DOCUMENTS

| Re. 31,114 | 12/1982 | Berg | 339/17 CF |
|---|---|---|---|
| 3,335,327 | 8/1967 | Damon et al. | 324/158 F |
| 4,026,412 | 5/1977 | Henson | 339/17 CF |
| 4,130,327 | 12/1978 | Spaulding | 339/176 MP |
| 4,376,560 | 3/1983 | Olsson et al. | 339/17 CF |
| 4,390,220 | 6/1983 | Benasutti | 339/175 C |

FOREIGN PATENT DOCUMENTS 1315028 4/1973 United Kingdom ........ 339/176 MP

OTHER PUBLICATIONS

"Elastomerics Connectors for Chip Carriers", by Piccirillo, 11th Annual Connector Symposium, Cherry Hill, N.J., 10/78, Jecknit, Inc.

Primary Examiner—Ernest F. Karlsen
Assistant Examiner—W. Burns
Attorney, Agent, or Firm—Leonard A. Alkov; Wanda K. Densson-Low

[57] ABSTRACT

A carrier for an integrated circuit package is disclosed which comprises a base (30) suitable for receiving an integrated circuit package with unformed leads (20') or formed leads (20), a cover (60), flexible material (66), such as an elastomer, disposed between the cover (60) and base (30) surfaces, and pressure is maintained across the cover (60) and base (30) by way of finger (44) on a clip (40) on the base (30) engaging latching edges (68) of cover (60). The leads (22) of the integrated circuit package (20, 20') are thereby secured in position by the elastomeric material (66) which forms itself partially around each of the leads in response to pressure applied across the base (30) and cover (60) as hereinabove described. The disclosed invention eliminates the need for separate grooves or nests in the base (30) of the carrier for each lead of the integrated circuit package.

2 Claims, 2 Drawing Sheets

INTEGRATED CIRCUIT PACKAGE CARRIER

BACKGROUND OF THE INVENTION

The present invention relates to integrated circuit packages and more particularly to carriers for packaging and handling high-lead density electronic integrated circuit packages, such as an 180-lead gate array package.

Electronic integrated circuit (IC) packages, such as large scale integration (LSI) circuits, very large scale integration (VLSI) circuits, very high speed integrated circuits (VHSIC), and gate array circuits, are typically constructed with a large number of electrical leads. The leads emanate out from the body of the integrated circuit and are typically connected by a soldering process to a larger electronic unit, such as wiring board or printed circuit board. The wiring board is used to electrically connect several integrated circuits for functioning together. Such a wiring board is installed in a unit of some electronics device, such as a radio, television, or radar system.

The complex configuration of electronics in modern integrated circuits results in a great number of electrical leads emanating from such circuits. In particular, a 180-lead gate array electronics package is an industry standard. The package is typically one and one-half inch on two sides and one inch on the other two sides with as many as fifty-four leads eminating from each of two sides of the integrated circuit and as many as thirty-six leads eminating from each of the other two sides of the package. This results in a very high-lead density configuration, with lead spacings on the order of 0.030 inch centers.

In order to protect the integrated circuit packages from damage in handling and installing onto wiring boards, a protective device for the circuit package is required. Such device is intended to protect both the body of the integrated circuit from damage and the leads eminating from the body from breakage.

One prior art approach to providing such lead protection for integrated circuit packages uses carriers having a separate groove or "nest" for each lead. Hughes Aircraft Company Part No. 821637 exemplifies a 42-lead package carrier and Hughes Aircraft Company Part No. 821638 exemplifies a 28-lead package carrier. These are the one-piece construction integrated circuit carriers containing separate grooves or "nests" for each lead to rest in. With the current designs for high-lead density integrated circuits, and corresponding close lead spacings center-to-center (e.g., 0.030 inches, and to the extreme of 0.025 inches), carriers with separate grooves for each lead cannot be produced nor effectively utilized without major difficulties. Manufacture of carriers with high-density grooves is extremely impractical and costly, because the groove spacing is required to be extremely close. Devices in use also cause brittle electrical-wire leads to break or bend.

Furthermore, one-piece construction of typical devices provides no protection to an integrated circuit package should the carrier be turned over.

SUMMARY OF THE INVENTION

It is therefore, a primary objective of the present invention to provide an improved carrier for assuring lead integrity of integrated circuit packages having high-lead densities.

Another object is to provide an improved carrier which does not require each of the leads to fit into a preformed groove.

Still another object is to provide an improved carrier which has flexible material such as an elastomeric material which automatically forms itself partially around each of the leads of an integrated circuit package so as to provide protection thereto.

Yet another object of the invention is to provide an improved carrier for high-lead density electronic circuits having either formed or unformed leads without the necessity for construction of separate grooves or nests for the respective leads. The invention can be used for both formed and unformed lead configurations.

A further object of the present invention is to provide an improved carrier for high-lead density integrated circuits to specifically protect brittle leads from breakage.

The present invention does not dictate that each electrical lead of the integrated circuit fit into a specific groove or nest. Rather, a flexible material such as an elastomeric seal which forms itself partially around each of the electical leads is employed.

A carrier for an integrated circuit package in accordance with one embodiment of the subject invention comprises a base suitable for receiving an integrated circuit package such that the leads are supported on surfaces thereof; a cover having surfaces in alignment with the base support surfaces; an elastomeric material disposed between the cover and base surfaces and means for maintaining pressure across the cover and base surfaces, whereby when an integrated circuit package is suitably disposed between the base and cover the leads are secured in position by the elastomeric material which forms itself partially around each of the leads in respond to the applied pressure.

A carrier for an integrated circuit package in accordance with one embodiment of the subject invention comprises a rectangular-shaped base with a supporting platform containing a rectangular-shaped indentation in the platform; a rectangular-shaped cover containing a flexible material on the bottom side of the cover; and a means for securing the base to the cover.

The body of the integrated circuit is placed into a supporting platform formed on an indented portion of the base of the package carrier. The leads eminating from the body of the integrated circuit are situated to lie on the tops of outer edges of the base of the package carrier. The supporting platform is recessed relative to the outer edges of the base in order to accommodate the shape of the body of the integrated circuit package. A cover portion of the package carrier contains a recessed groove on the bottom part of the cover into which flexible material, such as an elastomeric seal, is permanently affixed or disposed. When the cover is placed onto the base by way of a means for securing the integrated circuit package between the cover and base, the flexible seal contours partially around each lead with a force maintained on the leads and the seal by the securing means. The securing means generally is a set of clips on the base with latching edges in the cover. The clips are inserted into the latching edges causing a downward force to be maintained on the leads and the seal ring. This force secures each lead in place with the flexible material contouring partially around each lead. Consequently, the problem in the prior art of attempting to fit and secure leads into separate grooves is eliminated.

Novel relationships are set forth to demonstrate the general innovative approach. Other specific features and improvements are also disclosed.

BRIEF DESCRIPTION OF THE DRAWINGS

The novel features of this invention, as well as the invention itself, will be better understood from the accompanying description taken in connection with the accompanying drawings in which like reference characters refer to like parts in which.

DETAILED DESCRIPTION OF THE PREFERRED EMBODIMENTS

Figure 1:
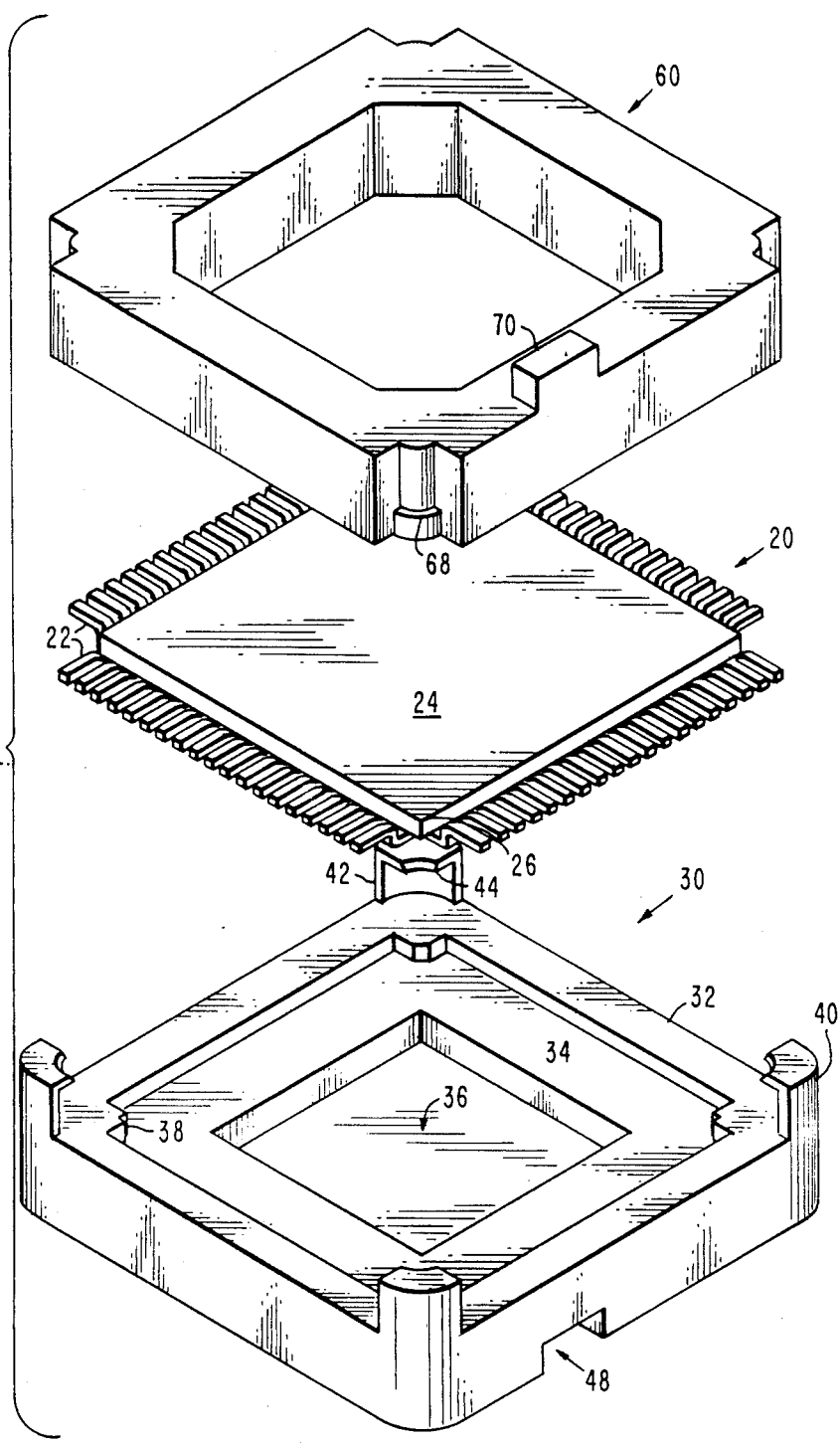
FIG. 1 is an exploded-view of an integrated circuit package carrier showing a top perspective view of a cover (top portion of FIG. 1), a top perspective view of a base of an integrated circuit package carrier (bottom portion of FIG. 1), and a top perspective view of an integrated circuit package having formed leads which is suitable for being carried by the carrier in accordance with the subject invention.

As shown in the drawings, one embodiment of a carrier for an integrated circuit package, such as shown at 20, in accordance with the subject invention comprises a base 30 and a cover 60.

Figure 4:
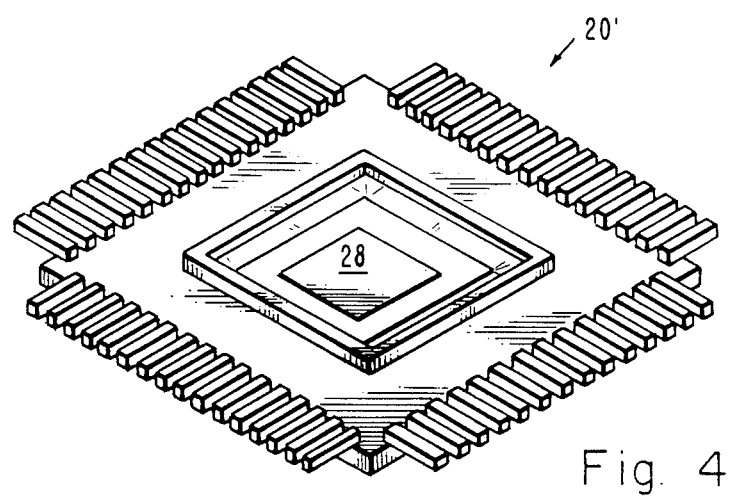
FIG. 4 is a top perspective view of an integrated circuit package having straight leads and which may also be carried by the integrated circuit package carriers in accordance with the subject invention.

As shown in FIG. 1, a rectangular shaped base 30 is adapted for receiving the integrated circuit package 20 with formed leads such that its leads 22 are supported on a surface 32. An indentation or a recess in the base 30, shown at 34, accommodates the body 24 of integrated circuit package 20 and an opening 36 is provided at the center of the base 30. Notches 38 are formed at each of the inner corners of base 30 for the purpose of mating with the corners 26 of the integrated circuit package 20 so as to align the package on the base. It is noted that the base 30 also accommodates the integrated circuit package 20' which has straight leads as shown in FIG. 4. In FIG. 4 the integrated circuit chip 28 is shown at the center of package 20'. The package carrier can be used for both formed and unformed lead circuit packages which avoids the need for separate tooling to accommodate each kind of package.

Clips are provided at each corner of the base 30 and comprise vertical members 42 with an orthogonal finger 44 at the top end thereof as shown in FIG. 1. Fingers 44 have sloping faces which tend to deflect the vertical member 42 outwardly during insertion of cover 60.

Figure 2:
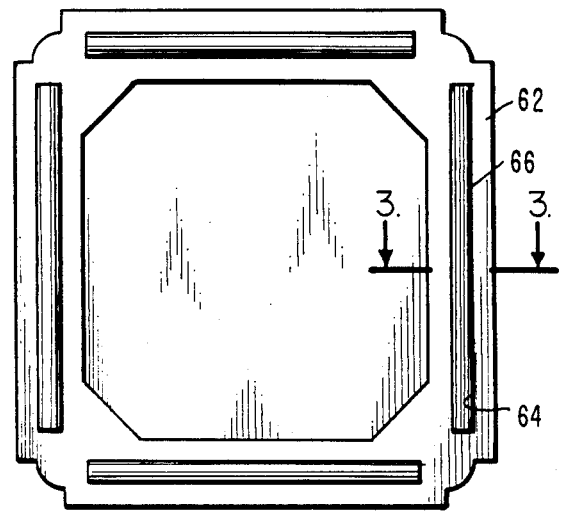
FIG. 2 is a bottom plan view of the cover of FIG. 1.
Figure 3:
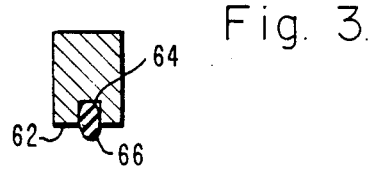
FIG. 3 is a perspective view of a section of the cover of FIG. 1 taken at 3—3 in FIG. 2.

As shown in FIGS. 1 and 2, cover 60 is rectangularly shaped with surfaces 62 that are adapted for alignment with support surfaces 32 of base 30. As shown in FIGS. 2 and 3 surface 62 has grooves 64 formed therein and these grooves would normally be longer than the width of the corresponding array of leads 22 from the integrated circuit package. Elastomeric material 66 shown in FIG. 3 is secured in groove 64 by a force fit or by adhesives, for example. Alternatively, elastomeric material 66 may be located in the top portion 32 of base 30 instead of the bottom portion 62 of cover 60 or the elastomeric material 66 could be located in both bottom of the cover 60 and the top of the base 30. As shown in FIG. 1 each corner of cover 60 has a latching ledge 68 formed therein.

To use the integrated circuit package carriers in accordance with the subject invention the integrated circuit package 20 is mounted in recess 34 of base 30 and cover 60 is snapped into place. Finger 44 of clip 40 on the base engage the latching ledges 68 of cover 60. The dimensions of the various components are chosen such that when the base and cover are latched together sufficient pressure is maintained therebetween so that the elastomeric material is deformed partially around each of the leads 22 of integrated circuit package 20. Protrusion 70 on the top of cover 60 is alignable with matching recess 48 in the bottom of base 30. These features allow the carrier to be securely stacked one on top of another.

The base and cover elements of the invention can be manufactured by standard injection-molding processes using thermoplastics.

Thus there has been described an improved protective carrier which assures lead integrity for high density integrated circuit packages such as the 180-lead gate array package, for example. The "grooveless" carrier is of two-piece construction and utilizes an elastomeric seal material which holds all leads securely in place. The carriers in accordance with the subject invention can be used with various lead density packages with either formed (FIG. 1) or unformed (FIG. 4) leads of various spacing and thickness. Carriers in accordance with the subject invention do not require each lead to fit into a particular groove. Rather the elastomeric material forms itself around the leads so as to hold them firmly in place.

What is claimed is:

1. An integrated circuit carrier comprising:

a rectangular-shaped base with a supporting platform containing a rectangular-shaped indentation disposed in the platform and an elastomeric material permanently affixed in a recessed groove on a top portion of said base;

a rectangular-shaped cover; and means for securing an integrated circuit having leads between said base and said cover, whereby the leads of an integrated circuit package suitably disposed between said base and said cover are secured in position by the flexible material which forms itself partially around each of the leads in response to pressure across said base and said cover imposed by said securing means.

2. A carrier for a high-lead density electronic integrated circuit package comprising:

a rectangular-shaped base with a supporting platform containing a rectangular-shaped indentation in the platform;

a rectangular-shaped cover containing a grooved recess along a bottom portion of said cover with a flexible material permanently affixed in said grooved recess; and means for securing said base to said cover consisting of clips disposed on said base and latching edges in said cover whereby said clips insert into said edges and said protruding clips contain a finger member perpendicularly disposed to a longitudinal clip axis at the top of said clip whereby said finger member has sloping faces, and whereby the leads of an integrated circuit package suitably disposed between said base and said cover are secured in position by said flexible material which forms itself partially around each of the leads in connection of said securing means.

* * * * *